(12) United States Patent
Sekiya

(10) Patent No.: US 12,040,214 B2
(45) Date of Patent: Jul. 16, 2024

(54) PROCESSING APPARATUS INCLUDING A CASSETTE MOUNTING SECTION, A READING SECTION, AND AN INFORMATION TRANSMITTING SECTION TRANSMITTING INFORMATION ON PROGRESS OF PROCESS STEPS TO CUSTOMER THAT HAS ORDERED THE PROCESSING OF EACH WORKPIECE

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 1441 days.

(21) Appl. No.: 16/375,329

(22) Filed: Apr. 4, 2019

(65) Prior Publication Data

US 2019/0318953 A1 Oct. 17, 2019

(30) Foreign Application Priority Data

Apr. 12, 2018 (JP) ................................. 2018-077105

(51) Int. Cl.
| | | |
|---|---|---|
| *H01L 21/683* | (2006.01) | |
| *B25J 15/06* | (2006.01) | |
| *H01L 21/67* | (2006.01) | |
| *H01L 21/673* | (2006.01) | |
| *H01L 21/677* | (2006.01) | |

(52) U.S. Cl.
CPC .......... *H01L 21/6838* (2013.01); *B25J 15/06* (2013.01); *H01L 21/67092* (2013.01); *H01L 21/67294* (2013.01); *H01L 21/67309* (2013.01); *H01L 21/6773* (2013.01); *H01L 21/67742* (2013.01)

(58) Field of Classification Search
CPC ........... H01L 21/6838; H01L 21/67092; H01L 21/67294; H01L 21/67309; H01L 21/6773; H01L 21/67742; H01L 21/67766; H01L 21/67778; H01L 21/67276; B25J 15/06

See application file for complete search history.

(56) References Cited

U.S. PATENT DOCUMENTS

| | | | | |
|---|---|---|---|---|
| 2003/0036971 A1* | 2/2003 | Tanabe | ................... | G06Q 30/06 |
| | | | | 705/26.5 |
| 2003/0233161 A1* | 12/2003 | Cheng | ................... | G06Q 10/06 |
| | | | | 700/121 |

FOREIGN PATENT DOCUMENTS

| | | |
|---|---|---|
| JP | 2002-41124 A | 2/2002 |
| JP | 2003-228412 A | 8/2003 |
| JP | 200545033 A | 2/2005 |

(Continued)

OTHER PUBLICATIONS

Office Action issued by the State Intellectual Property Office of People's Republic of China in corresponding CN Application No. 201910279345.8.

(Continued)

*Primary Examiner* — Ermias T Woldegeorgis
(74) *Attorney, Agent, or Firm* — GREER BURNS & CRAIN, LTD.

(57) ABSTRACT

A processing apparatus includes a cassette mounting section mounting a cassette storing a plurality of workpieces, a reading section reading an identification code provided on the cassette mounted on the cassette mounting section, and an information transmitting section transmitting information on the progress of process steps in processing each workpiece stored in the cassette, to a customer that has ordered the processing of each workpiece stored in the cassette.

17 Claims, 5 Drawing Sheets

(56) References Cited

FOREIGN PATENT DOCUMENTS

| | | | | |
|---|---|---|---|---|
| JP | 2010182837 | A | * | 8/2010 |
| JP | 2017011178 | A | * | 1/2017 |
| JP | 2017011178 | A | | 1/2017 |

OTHER PUBLICATIONS

Office Action issued by the Patent Office of Japan in corresponding JP Application No. 2018-077105, dated Nov. 17, 2021.

* cited by examiner

PROCESSING APPARATUS INCLUDING A CASSETTE MOUNTING SECTION, A READING SECTION, AND AN INFORMATION TRANSMITTING SECTION TRANSMITTING INFORMATION ON PROGRESS OF PROCESS STEPS TO CUSTOMER THAT HAS ORDERED THE PROCESSING OF EACH WORKPIECE

BACKGROUND OF THE INVENTION

Field of the Invention

The present invention relates to a processing apparatus.

Description of the Related Art

In processing a plate-shaped workpiece having a plurality of separate regions defined by a plurality of division lines, in which regions a plurality of semiconductor devices are to be formed or various functions are to be provided, and dividing the workpiece along the division lines to obtain a plurality of device chips, various many processing apparatuses are used to perform various kinds of processing (see Japanese Patent Laid-Open No. 2005-045033 and Japanese Patent Laid-Open No. 2017-11178, for example). In the case of manufacturing a plurality of semiconductor device chips, the process includes a step of manufacturing a wafer, a step of forming a plurality of semiconductor devices on the wafer, a step of reducing the thickness of the wafer, and a step of dividing the wafer. These process steps are usually performed in different plants.

SUMMARY OF THE INVENTION

In performing such a series of process steps to manufacture the semiconductor device chips, a customer that has ordered the manufacture of the device chips has no information on the progress of the process steps until a delivery date is reached. Accordingly, even when there arises a problem such that the delivery of the products is delayed, the customer cannot expect this delay in advance.

It is therefore an object of the present invention to provide a processing apparatus which allows the customer to grasp the progress of process steps in processing a workpiece.

In accordance with an aspect of the present invention, there is provided a processing apparatus including a cassette mounting section mounting a cassette storing a plurality of plate-shaped workpieces, a reading section reading an identification code provided on the cassette mounted on the cassette mounting section, and an information transmitting section transmitting information on the progress of process steps in processing each workpiece stored in the cassette, to a customer that has ordered the processing of each workpiece stored in the cassette.

Preferably, in the processing apparatus, the cassette mounted on the cassette mounting section includes a coin stack cassette as a first cassette storing the plurality of plate-shaped workpieces in a stacked condition. The processing apparatus further includes a processing unit transferring each workpiece from the coin stack cassette to a second cassette having a plurality of pairs of shelves for individually supporting the plurality of plate-shaped workpieces in such a manner that each workpiece is supported by each pair of shelves.

More preferably, in the processing apparatus, the plurality of plate-shaped workpieces include a plurality of semiconductor wafers stored in the coin stack cassette. A plurality of protective sheets are also stored in the coin stack cassette in a condition where the plurality of semiconductor wafers and the plurality of protective sheets are alternately stacked, and the processing unit includes a determining unit determining whether an object to be transferred by the processing unit is each workpiece or each protective sheet, each semiconductor wafer only being stored into the second cassette by the processing unit according to the result of determination by the determining unit.

The present invention can exhibit an effect that the customer can grasp the progress of process steps in processing each workpiece.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described in detail with reference to the drawings. The present invention is not limited to this preferred embodiment described below. Further, the components used in this preferred embodiment may include those that can be easily assumed by persons skilled in the art or substantially the same elements as those known in the art. Further, the configurations described below may be suitably combined. Further, the configurations may be variously omitted, replaced, or changed without departing from the scope of the present invention.

Preferred Embodiment

Figure 1:
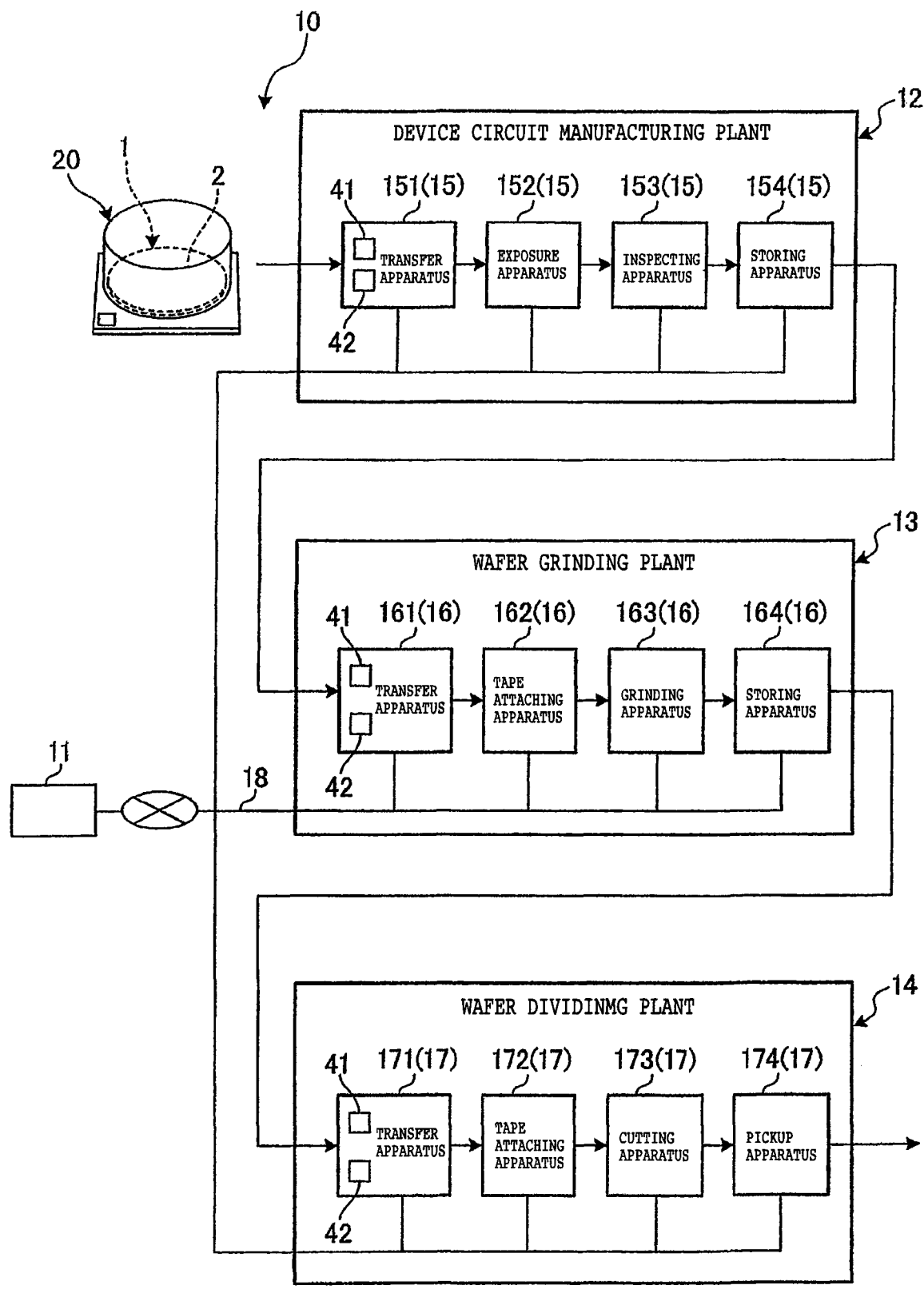
FIG. 1 is a schematic diagram illustrating a device chip manufacturing factory including a transfer apparatus as a processing apparatus according to a preferred embodiment of the present invention.
Figure 2:
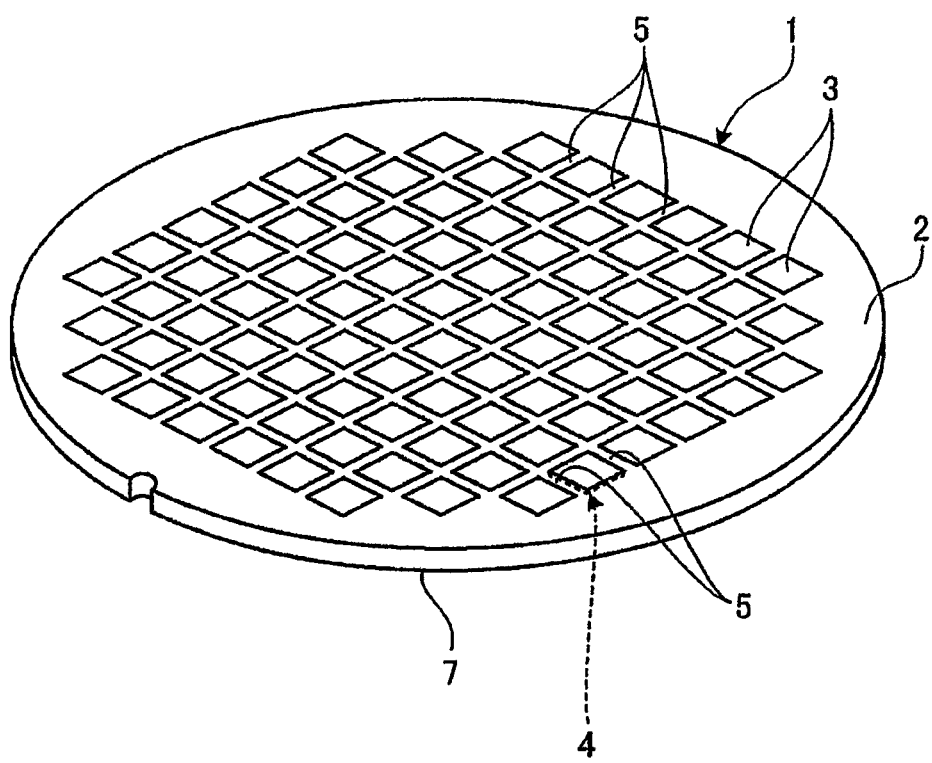
FIG. 2 is a perspective view of a workpiece to be processed in the device chip manufacturing factory illustrated in FIG. 1.
Figure 3:
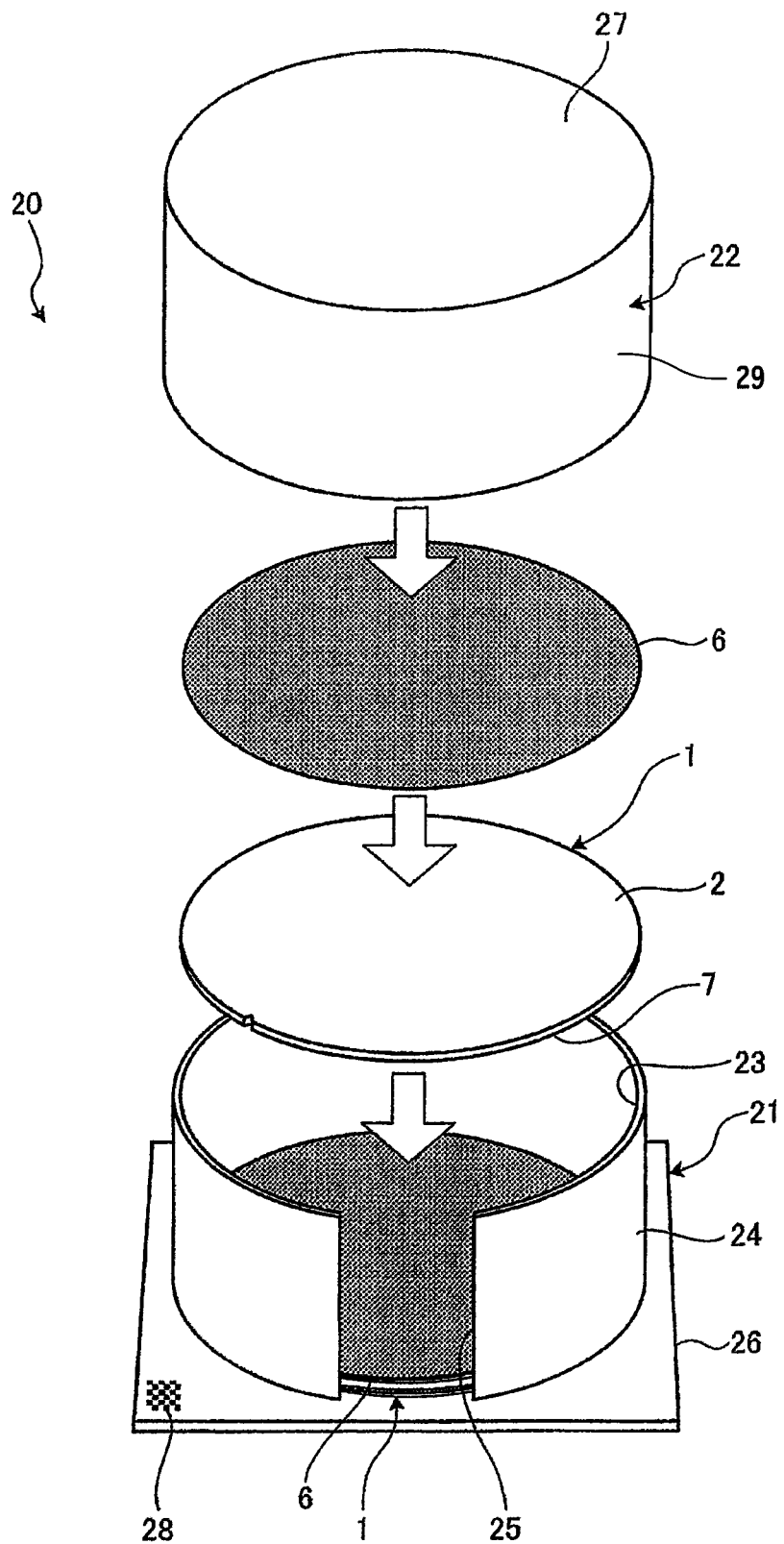
FIG. 3 is a perspective view of a coin stack cassette storing a plurality of workpieces to be carried into the device chip manufacturing factory illustrated in FIG. 1.
Figure 4:
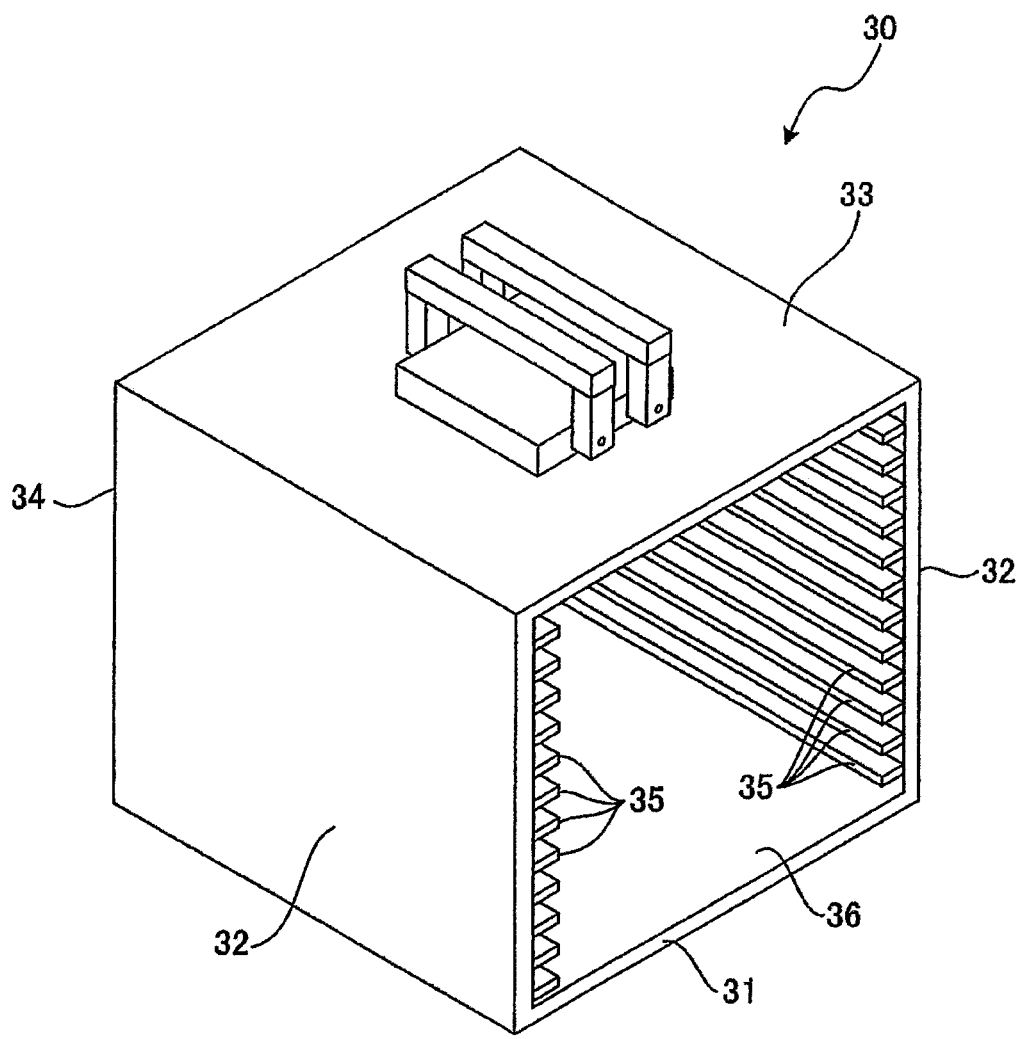
FIG. 4 is a perspective view of a cassette for use in the device chip manufacturing factory illustrated in FIG. 1.

A processing apparatus according to a preferred embodiment of the present invention will now be described with reference to the drawings. FIG. 1 is a schematic diagram illustrating a device chip manufacturing factory including a transfer apparatus as an example of the processing apparatus according to this preferred embodiment. FIG. 2 is a perspective view of a workpiece to be processed in the device chip manufacturing factory illustrated in FIG. 1. FIG. 3 is a perspective view of a coin stack cassette storing a plurality of workpieces to be carried into the device chip manufacturing factory illustrated in FIG. 1. FIG. 4 is a perspective view of a cassette for use in the device chip manufacturing factory illustrated in FIG. 1.

(Device Chip Manufacturing Factory)

As illustrated in FIG. 1, reference numeral 10 generally denotes the device chip manufacturing factory according to this preferred embodiment. In the device chip manufacturing factory 10, a workpiece 1 is processed in such a manner that a plurality of devices 3 are first formed on the front side 2 of the workpiece 1 as illustrated in FIG. 2 and the workpiece 1 is then divided into a plurality of individual device chips 4 to thereby manufacture the device chips 4. The workpiece 1 to be processed in the device chip manufacturing factory 10 is a disk-shaped semiconductor wafer or an optical device wafer formed of silicon, sapphire, or gallium arsenide, for example, as a base material. As illustrated in FIG. 2, a plurality of crossing division lines 5 are formed on the front side 2 of the workpiece 1 to define a plurality of separate regions, and the plural devices 3 are respectively formed in these plural separate regions. After forming the devices 3 on the front side 2 of the workpiece 1, the workpiece 1 is divided along the division lines 5 to obtain the plural device chips 4. Accordingly, each device chip 4 includes one of the devices 3 and a part of the workpiece 1 in each separate region.

In the preferred embodiment, the device chip manufacturing factory 10 illustrated in FIG. 1 is a factory for taking an order from a customer (e.g., electronic equipment maker) 11 and then delivering the device chips 4 to the customer 11 according to the order. The customer 11 is one that has ordered the manufacture of the device chips 4 from the workpiece 1 (i.e., the processing of the workpiece 1). In this preferred embodiment, a plurality of workpieces 1 are previously stored in a coin stack cassette 20 as a first cassette illustrated in FIG. 3, and the coin stack cassette 20 thus storing the plural workpieces 1 is carried into the device chip manufacturing factory 10.

As illustrated in FIG. 3, the coin stack cassette 20 is a cassette adapted to store a plurality of workpieces 1 in a vertically stacked condition. The coin stack cassette 20 includes a storing member 21 having an upper opening 23, and each workpiece 1 is adapted to be stored into the storing member 21 through the upper opening 23 and also adapted to be taken out of the storing member 21 through the upper opening 23.

As illustrated in FIG. 3, the coin stack cassette 20 further includes a lid 22. That is, the coin stack cassette 20 is composed of the storing member 21 and the lid 22 for closing the upper opening 23 of the storing member 21. The storing member 21 is composed of a cylindrical wall 24 having the upper opening 23 and a base member (bottom wall) 26 connected to the lower end of the cylindrical wall 24. The cylindrical wall 24 is formed with a cutout 25. The cylindrical wall 24 is so formed as to define an inside space for storing the plural workpieces 1. The upper opening 23 is formed at the upper end of the cylindrical wall 24 so as to allow the pass of each workpiece 1. The cutout 25 is formed by partially cutting the cylindrical wall 24 from the upper end to the lower end thereof along the axis of the cylindrical wall 24. The base member 26 is a plate-shaped member having a rectangular shape as viewed in plan. The base member 26 is connected to the lower end of the cylindrical wall 24 so as to close the lower end (lower opening) of the cylindrical wall 24.

The lid 22 is a cylindrical member having a top wall 27 and a cylindrical wall 29, and the top wall 27 is connected to the upper end of the cylindrical wall 29 so as to close the upper end (upper opening) of the cylindrical wall 29. The lid 22 is so configured as to be fitted to the storing member 21. That is, the cylindrical wall 29 of the lid 22 is adapted to be fitted to the cylindrical wall 24 of the storing member 21 so as to cover the outer surface of the cylindrical wall 24 in the condition where the top wall 27 of the lid 22 is opposed to the base member 26 of the storing member 21.

The storing member 21 of the coin stack cassette 20 is adapted to also store a plurality of protective sheets 6 in a vertically stacked condition in such a manner that the plural workpieces 1 and the plural protective sheets 6 are alternately stacked. Each protective sheet 6 is formed of a material softer than the material of each workpiece 1, such as paper and synthetic resin. Each protective sheet 6 has a size substantially the same as that of each workpiece 1. That is, each protective sheet 6 is allowed to pass through the upper opening 23 of the cylindrical wall 24. In this manner, the plural workpieces 1 and the plural protective sheets 6 are adapted to be alternately stored into the storing member 21 through the upper opening 23 and alternately taken out of the storing member 21 through the upper opening 23.

Further, an identification code 28 is provided on the outer surface of the coin stack cassette 20. In this preferred embodiment, the identification code 28 is formed on the upper surface of the base member 26. The identification code 28 contains various pieces of information such as information on the customer 11, the kind of the device chips 4 to be manufactured, and the number of the workpieces 1. Examples of the identification code 28 include a bar code and a quick response (QR) code (registered trademark).

As illustrated in FIG. 1, the device chip manufacturing factory 10 includes a device circuit manufacturing plant 12, a wafer grinding plant 13, and a wafer dividing plant 14. The device circuit manufacturing plant 12 is a plant for forming the devices 3 on the front side 2 of each workpiece 1. Examples of each device 3 include an integrated circuit (IC), a large scale integrated circuit (LSI), and a micro electro mechanical systems (MEMS).

The device circuit manufacturing plant 12 includes various processing apparatuses 15 for processing each workpiece 1 to form the devices 3 on the front side 2 of each workpiece 1. In this preferred embodiment, the processing apparatuses 15 included in the device circuit manufacturing plant 12 are a transfer apparatus 151, exposure apparatus (aligner) 152, inspecting apparatus 153, and storing apparatus 154. The transfer apparatus 151 is an apparatus for transferring each workpiece 1 from the coin stack cassette 20 as a first cassette illustrated in FIG. 3 to a cassette 30 as a second cassette illustrated in FIG. 4, which will be hereinafter described. The exposure apparatus 152 is an apparatus for performing exposure to form the devices 3 (circuit patterns) on the front side 2 of each workpiece 1. The inspecting apparatus 153 is an apparatus for inspecting the devices 3 formed on the front side 2 of each workpiece 1. The storing apparatus 154 is an apparatus for storing each workpiece 1 into the cassette 30.

The cassette 30 is adapted to store a plurality of workpieces 1 in the condition where the workpieces 1 are vertically stacked at given intervals. As illustrated in FIG. 4, the cassette 30 includes a bottom wall 31, a pair of side walls 32 extending upright from the opposite lateral ends of the bottom wall 31 so as to be laterally opposed to each other, a top wall 33 connecting the upper ends of the side walls 32 so as to be vertically opposed to the bottom wall 31, and a rear wall 34 connecting the rear ends of all the bottom wall 31, the side walls 32, and the top wall 33. The opposed inside surfaces of the side walls 32 are formed with a plurality of pairs of shelves 35 for supporting the plural workpieces 1 in the condition where the diametrically opposite end portions of each workpiece 1 are placed on each pair of shelves 35. On the inside surface of each side wall 32, the plural shelves 35 extend parallel to each other in a horizontal direction so as to be spaced from each other in a vertical direction. In each pair of shelves 35, the shelf 35 formed on one of the side walls 32 is at the same level as the shelf 35 formed on the other side wall 32.

The cassette 30 further includes a front opening 36 defined by the bottom wall 31, the pair of side walls 32, and the top wall 33. Accordingly, the front opening 36 is so formed as to allow the pass of each workpiece 1 in storing each workpiece 1 into the cassette 30 or taking each workpiece 1 out of the cassette 30. That is, each workpiece 1 is adapted to be horizontally passed through the front opening 36 and placed on each pair of shelves 35. In this manner, a plurality of workpieces 1 are stored in the cassette 30 in the condition where the diametrically opposite end portions of each workpiece 1 are supported on each pair of shelves 35 and vertically arranged at given intervals. In storing each workpiece 1 into the cassette 30 or taking each workpiece 1 out of the cassette 30, each workpiece 1 is horizontally moved so as to pass through the front opening 36. Although not illustrated, an identification code similar to the identification code 28 illustrated in FIG. 3 is provided on the cassette 30.

After forming the devices 3 on the front side 2 of each workpiece 1 in the device circuit manufacturing plant 12, the plural workpieces 1 stored in the cassette 30 are carried to the wafer grinding plant 13. The wafer grinding plant 13 is a plant for grinding the back side 7 of each workpiece 1 having the devices 3 on the front side 2 to thereby reduce the thickness of each workpiece 1 to a finished thickness. The wafer grinding plant 13 includes various processing apparatuses 16 for processing each workpiece 1 to grind the back side 7 of each workpiece 1. In this preferred embodiment, the processing apparatuses 16 included in the wafer grinding plant 13 are a transfer apparatus 161, tape attaching apparatus 162, grinding apparatus 163, and storing apparatus 164. The transfer apparatus 161 is an apparatus for transferring each workpiece 1 from the cassette 30 to another cassette 30. That is, the cassette 30 for use in the device circuit manufacturing plant 12 is changed to another similar cassette 30 for use in the wafer grinding plant 13. The tape attaching apparatus 162 is an apparatus for attaching a protective tape as a protective member to the front side 2 of each workpiece 1. The grinding apparatus 163 is an apparatus for grinding the back side 7 of each workpiece 1. The storing apparatus 164 is an apparatus for storing each workpiece 1 into the cassette 30.

After grinding the back side 7 of each workpiece 1 in the wafer grinding plant 13, the plural workpieces 1 stored in the cassette 30 are carried to the wafer dividing plant 14. The wafer dividing plant 14 is a plant for dividing each workpiece 1 the back side 7 of which has already been ground, into the individual device chips 4. The wafer dividing plant 14 includes various processing apparatuses 17 for processing each workpiece 1 to divide each workpiece 1 into the individual device chips 4. In this preferred embodiment, the processing apparatuses 17 included in the wafer dividing plant 14 are a transfer apparatus 171, tape attaching apparatus 172, cutting apparatus 173, and pickup apparatus 174. The transfer apparatus 171 is an apparatus for transferring each workpiece 1 from the cassette 30 to another cassette 30. That is, the cassette 30 for use in the wafer grinding plant 13 is changed to another similar cassette 30 for use in the wafer dividing plant 14. The tape attaching apparatus 172 is an apparatus for attaching a dicing tape to the back side 7 of each workpiece 1, attaching the peripheral portion of the dicing tape to a ring frame, and peeling the protective tape from the front side 2 of each workpiece 1. The cutting apparatus 173 is an apparatus for cutting each workpiece 1 along each division line 5 to obtain the individual device chips 4. The pickup apparatus 174 is an apparatus for picking up each device chip 4 from the dicing tape.

Further, the processing apparatuses 15, 16, and 17 in the plants 12, 13, and 14 of the device chip manufacturing factory 10 are connected through a network 18 to the customer 11 in such a manner that information communications are allowed. In this preferred embodiment, the network 18 is a wide area network (WAN) such as the Internet.

In this preferred embodiment, each of the transfer apparatuses 151, 161, and 171 in the plants 12, 13, and 14 of the device chip manufacturing factory 10 includes a reading unit (corresponding to a reading section) 41 for reading the identification code 28, and an information transmitting section 42 for transmitting to the customer 11 the information read by the reading unit 41 and the information indicating that each workpiece 1 has been carried to the plants 12, 13, and 14. The information transmitting section 42 is an interface for allowing communication with other equipment through the network 18. Basically, all the transfer apparatuses 151, 161, and 171 have the same configuration. Accordingly, only the transfer apparatus 151 will be mainly described with reference to FIG. 5.

(Transfer Apparatus)

Figure 5:
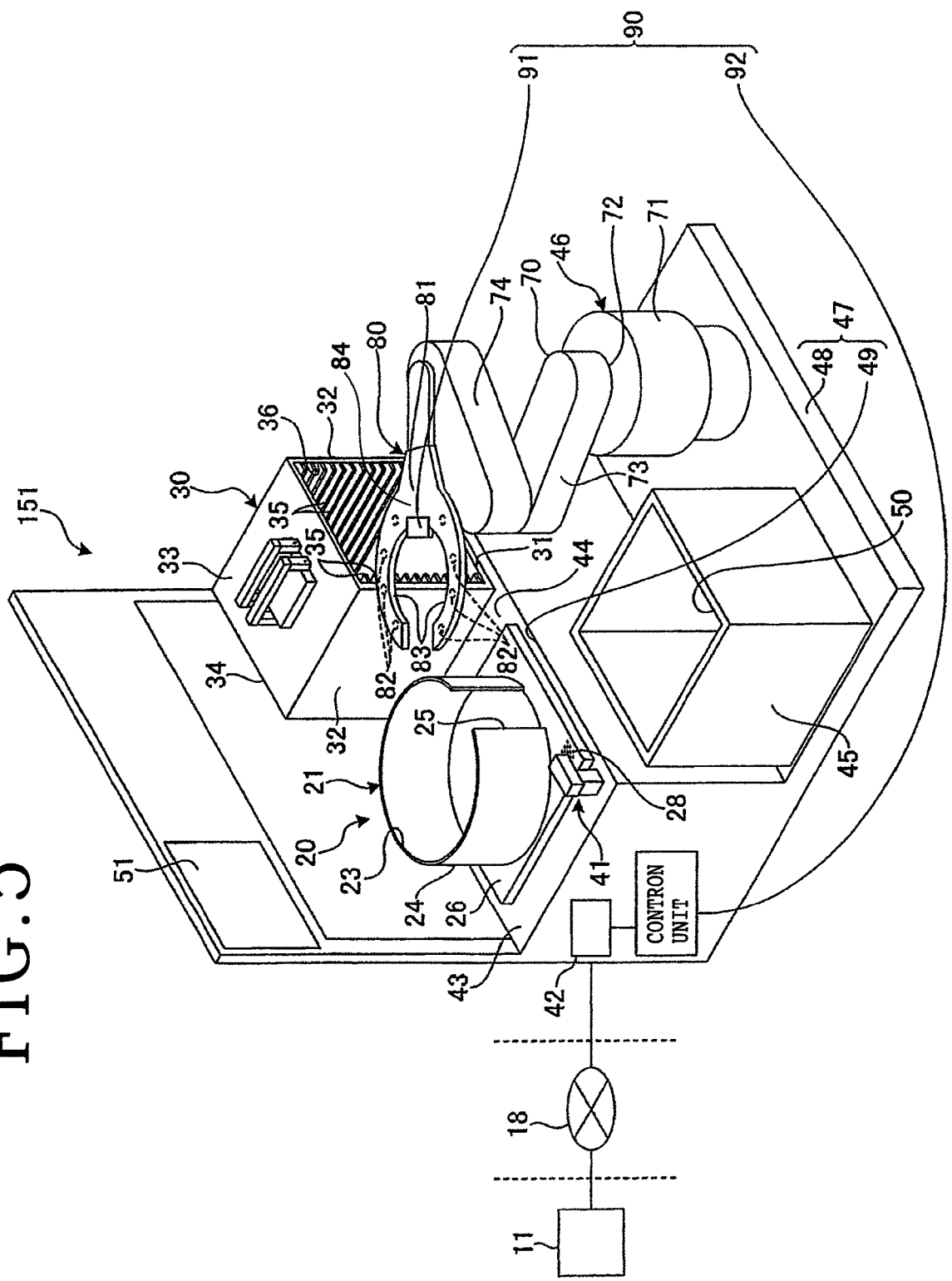
FIG. 5 is a perspective view illustrating a configuration example of the transfer apparatus as the processing apparatus according to this preferred embodiment.

FIG. 5 is a perspective view illustrating the configuration of the transfer apparatus 151 as the processing apparatus according to this preferred embodiment. As illustrated in FIG. 5, the transfer apparatus 151 includes a coin stack cassette mounting section 43 as a cassette mounting section for mounting the storing member 21 of the coin stack cassette 20, a reading unit 41 for reading the identification code 28 provided on the coin stack cassette 20 mounted on the coin stack cassette mounting section 43, a cassette mounting section 44 for mounting the cassette 30, a protective sheet storing box 45 for storing the protective sheets 6, a transfer unit 46 as a processing unit, and an information transmitting section 42.

The transfer apparatus 151 further includes a base housing 47, and all of the coin stack cassette mounting section 43, the cassette mounting section 44, and the protective sheet storing box 45 are provided on the base housing 47. More specifically, the base housing 47 has a lower stage 48 and an upper stage 49 higher in level than the lower stage 48. The coin stack cassette mounting section 43 and the cassette mounting section 44 are provided on the upper stage 49, whereas the protective sheet storing box 45 is provided on the lower stage 48. In this preferred embodiment, the reading unit 41 of the transfer apparatus 151 is provided on the coin stack cassette mounting section 43. The protective sheet storing box 45 is a quadrangular box having an inside space for storing a plurality of protective sheets 6. The protective sheet storing box 45 has an upper opening 50 for allowing the pass of each protective sheet 6.

The transfer unit 46 functions to take each workpiece 1 or each protective sheet 6 out of the coin stack cassette 20 mounted on the coin stack cassette mounting section 43, next transfer each workpiece 1 to the cassette 30 mounted on the cassette mounting section 44, and next transfer each protective sheet 6 to the protective sheet storing box 45. The transfer unit 46 includes a movable arm 70, a holder 80, and a determining unit 90.

The movable arm 70 is provided on the lower stage 48 of the base housing 47 of the transfer apparatus 151. The movable arm 70 includes elevating means 71 provided on the lower stage 48 of the base housing 47, turning means 72 mounted at the upper end of the elevating means 71, a first arm 73 mounted at the upper end of the turning means 72 so as to be horizontally rotatable about a vertical axis, and a second arm 74 mounted at the front end of the first arm 73 so as to be horizontally rotatable about a vertical axis. The holder 80 is mounted at the front end of the second arm 74 so as to be horizontally rotatable about a vertical axis and also vertically rotatable about a horizontal axis.

The holder 80 includes a C-shaped body 81 formed like a plate member, and a plurality of (e.g., eight in this preferred embodiment) suction pads 82 provided on the C-shaped body 81. Each suction pad 82 functions to discharge air as a fluid against each workpiece 1 or each protective sheet 6, thereby generating a vacuum to hold each workpiece 1 or each protective sheet 6 under suction in a noncontact condition.

The body 81 of the holder 80 is formed from a stainless steel plate, for example. The body 81 has a pair of arcuate portions 83 opposed to each other in a horizontal plane and a base portion 84 connecting the pair of arcuate portions 83. The base portion 84 of the body 81 is connected to the front end of the second arm 74 of the movable arm 70. In this preferred embodiment, each arcuate portion 83 is provided with the four suction pads 82 arranged at given intervals along the arc of each arcuate portion 83. Further, the four suction pads 82 provided on one of the two arcuate portions 83 and the four suction pads 82 provided on the other arcuate portion 83 are symmetrical with respect to an axis horizontally extending through the base portion 84 and between the opposed arcuate portions 83.

Each suction pad 82 is a so-called Bernoulli pad for holding each workpiece 1 or each protective sheet 6 under suction in a noncontact condition obtained by utilizing a vacuum due to a Bernoulli effect. That is, this vacuum can be produced by discharging a pressurized air supplied from a fluid source (not illustrated) against each workpiece 1 or each protective sheet 6. More specifically, all the suction pads 82 are provided on the lower surfaces of the arcuate portions 83 of the body 81 of the holder 80.

The determining unit 90 functions to distinguish between each workpiece 1 and each protective sheet 6. The determining unit 90 includes vibration detecting means 91 and a control unit 92.

The vibration detecting means 91 functions to detect the vibration of each workpiece 1 or each protective sheet 6 due to the air discharged from the suction pads 82. The vibration detecting means 91 is located at the base portion 84 of the body 81 of the holder 80. More specifically, the vibration detecting means 91 is configured by a microphone for detecting the sound due to the vibration of each workpiece 1 or each protective sheet 6. The frequency of the sound detected by the microphone is analyzed by a fast fourier transform (FFT) analyzer. Then, according to the frequency band and the loudness of the sound detected, the control unit 92 determines whether the object held by the suction pads 82 is each workpiece 1 or each protective sheet 6.

The control unit 92 functions to control the components of the transfer apparatus 151 in the operation of transferring each workpiece 1 or each protective sheet 6 by using the transfer unit 46. The control unit 92 is configured by a computer including a computing section having a microprocessor such as a central processing unit (CPU), a storage section having a memory such as a read only memory (ROM) and a random access memory (RAM), and an input/output interface section. The computing section of the control unit 92 functions to compute according to a computer program stored in the storage section and then output a control signal through the input/output interface section to each component of the transfer apparatus 151, thereby controlling the transfer apparatus 151.

The control unit 92 is connected to a display unit 51 such as a liquid crystal display for displaying an operational condition, image, etc. and also connected to an input unit adapted to be used by an operator in recording information on the content of processing or the like. The input unit includes at least one of a touch panel provided on the display unit 51 and an external input apparatus such as a keyboard.

The control unit 92 functions to determine whether the object held by the transfer unit 46 is each workpiece 1 or each protective sheet 6. More specifically, the control unit 92 determines whether the object held by the transfer unit 46 is each workpiece 1 or each protective sheet 6 according to the loudness and the frequency band of the sound detected by the microphone. For example, when the loudness of the sound is greater than a predetermined value, e.g., 100 db, the control unit 92 determines that the object held by the transfer unit 46 is each protective sheet 6, whereas when the loudness of the sound is less than or equal to the predetermined value (e.g., 100 db), the control unit 92 determines that the object held by the transfer unit 46 is each workpiece 1.

Further, when the object held by the transfer unit 46 is determined to be each workpiece 1, the control unit 92 controls the flow rate of the air to be discharged from the suction pads 82 to a first flow rate, e.g., 85 L/min to 110 L/min, which is a preset value at which each workpiece 1 can be held by the suction pads 82. The control unit 92 further controls the pressure of the pressurized air to be supplied from the fluid source to 0.3 MPa (gauge pressure) in this case. Under these conditions, the control unit 92 controls the transfer unit 46 to transfer each workpiece 1 from the coin stack cassette 20 to the cassette 30. Conversely, when the object held by the transfer unit 46 is determined to be each protective sheet 6, the control unit 92 controls the flow rate of the air to be discharged from the suction pads 82 to a second flow rate, e.g., 40 L/min to 65 L/min, lower than the first flow rate, which is a preset value at which each protective sheet 6 can be held by the suction pads 82 and each protective sheet 6 does not produce any abnormal noise due to the vibration (i.e., no resonance occurs). The control unit 92 further controls the pressure of the pressurized air to be supplied from the fluid source to 0.15 MPa (gauge pressure) in this case. Under these conditions, the control unit 92 controls the transfer unit 46 to transfer each protective sheet 6 from the coin stack cassette 20 to the protective sheet storing box 45. In this manner, the pressurized air as a fluid is supplied to the suction pads 82 of the transfer unit 46 at a predetermined flow rate according to the kind of the object held by the transfer unit 46.

In the operation of the transfer apparatus 151, the coin stack cassette 20 is placed on the coin stack cassette mounting section 43 in the condition where the lid 22 has been removed. Thereafter, the identification code 28 of the coin stack cassette 20 placed on the coin stack cassette mounting section 43 is read by the reading unit 41. Thereafter, the information read from the identification code 28 and the information indicating that the workpieces 1 have been carried into the device circuit manufacturing plant 12 are transmitted through the network 18 to the customer 11 by the information transmitting section 42. In this manner, the information transmitting section 42 notifies the customer 11 that the workpieces 1 stored in the coin stack cassette 20 have been carried into the device circuit manufacturing plant 12.

Thereafter, the determining unit 90 determines whether the object held by the transfer unit 46 is each workpiece 1 or each protective sheet 6. According to the result of this determination, each workpiece 1 only is stored into the cassette 30 by the transfer unit 46, and each protective sheet 6 is stored into the protective sheet storing box 45.

The configuration of each of the other transfer apparatuses 161 and 171 is similar to the configuration of the transfer apparatus 151 mentioned above with the exception that the cassette 30 is adapted to be placed on the coin stack cassette mounting section 43 of the transfer apparatus 161 or 171. Accordingly, the configuration of each of the other transfer apparatuses 161 and 171 will be omitted herein. In the operation of the transfer apparatus 161, the cassette 30 storing the workpieces 1 is carried into the wafer grinding plant 13 and then placed on the coin stack cassette mounting section 43 of the transfer apparatus 161. Thereafter, the identification code of the cassette 30 placed on the coin stack cassette mounting section 43 of the transfer apparatus 161 is read by the reading unit 41 of the transfer apparatus 161. Thereafter, the information read from the identification code and the information indicating that the workpieces 1 have been carried into the wafer grinding plant 13 are transmitted through the network 18 to the customer 11 by the information transmitting section 42 of the transfer apparatus 161. In this manner, the information transmitting section 42 of the transfer apparatus 161 notifies the customer 11 that the workpieces 1 stored in the cassette 30 have been carried into the wafer grinding plant 13. Thereafter, the transfer unit 46 of the transfer apparatus 161 is operated to transfer each workpiece 1 from the cassette 30 placed on the coin stack cassette mounting section 43 of the transfer apparatus 161 to the cassette 30 placed on the cassette mounting section 44 of the transfer apparatus 161.

In the operation of the transfer apparatus 171, the cassette 30 storing the workpieces 1 is carried into the wafer dividing plant 14 and then placed on the coin stack cassette mounting section 43 of the transfer apparatus 171. Thereafter, the identification code of the cassette 30 placed on the coin stack cassette mounting section 43 of the transfer apparatus 171 is read by the reading unit 41 of the transfer apparatus 171. Thereafter, the information read from the identification code and the information indicating that the workpieces 1 have been carried into the wafer dividing plant 14 are transmitted through the network 18 to the customer 11 by the information transmitting section 42 of the transfer apparatus 171. In this manner, the information transmitting section 42 of the transfer apparatus 171 notifies the customer 11 that the workpieces 1 stored in the cassette 30 have been carried into the wafer dividing plant 14. Thereafter, the transfer unit 46 of the transfer apparatus 171 is operated to transfer each workpiece 1 from the cassette 30 placed on the coin stack cassette mounting section 43 of the transfer apparatus 171 to the cassette 30 placed on the cassette mounting section 44 of the transfer apparatus 171.

In this preferred embodiment, the information indicating that the workpieces 1 stored in the coin stack cassette 20 have been carried into the device circuit manufacturing plant 12, the information indicating that the workpieces 1 stored in the cassette 30 have been carried into the wafer grinding plant 13, and the information indicating that the workpieces 1 stored in the cassette 30 have been carried into the wafer dividing plant 14 indicate the progress of the manufacturing steps for the device chips 4 (i.e., the processing steps for each workpiece 1).

As described above, each of the transfer apparatuses 151, 161, and 171 as the processing apparatus according to this preferred embodiment has the following advantages. When the coin stack cassette 20 or the cassette 30 is carried into the plant 12, 13, or 14, the identification code 28 or similar code is read by the reading unit 41 and the progress of the manufacturing steps for the device chips 4 is transmitted to the customer 11 by the information transmitting section 42. In other words, the customer 11 can grasp the progress of the manufacturing steps for the device chips 4 by receiving the information from the transfer apparatuses 151, 161, and 171 as the processing apparatus according to this preferred embodiment.

Further, when the coin stack cassette 20 or the cassette 30 is placed on the coin stack cassette mounting section 43 in each of the transfer apparatuses 151, 161, and 171 as the processing apparatus according to this preferred embodiment, the identification code 28 or similar code is read by the reading unit 41. Accordingly, the progress of the manufacturing steps for the device chips 4 can be automatically transmitted from the plants 12, 13, and 14 to the customer 11. As a result, an increase in number of man-hours in the plants 12, 13, and 14 can be suppressed by using the transfer apparatuses 151, 161, and 171 as the processing apparatus according to this preferred embodiment.

Further, the device chip manufacturing factory 10 according to this preferred embodiment includes the plants 12, 13, and 14 respectively including the transfer apparatuses 151, 161, and 171, and the progress of the manufacturing steps for the device chips 4 is transmitted from each of the transfer apparatuses 151, 161, and 171. Accordingly, the customer 11 can grasp the progress of the processing in each of the plants 12, 13, and 14.

The transfer unit 46 in the transfer apparatus 151 as the processing apparatus includes the determining unit 90 for determining whether the object held by the transfer unit 46 is each workpiece 1 or each protective sheet 6, and according to the result of this determination, each workpiece 1 stored in the coin stack cassette 20 is transferred to the cassette 30, and each protective sheet 6 stored in the coin stack cassette 20 is transferred to the protective sheet storing box 45. Accordingly, in the transfer apparatus 151 as the processing apparatus, each workpiece 1 and each protective sheet 6 both stored in the coin stack cassette 20 can be automatically distinguished from each other without the need for the operation by an operator, and they can be automatically transferred to the cassette 30 and the protective sheet storing box 45, respectively. As a result, the time required for the transfer of each workpiece 1 from the coin stack cassette 20 to the cassette 30 can be suppressed in the transfer apparatus 151.

Further, when each protective sheet 6 is held under suction by the holder 80 in the transfer apparatus 151, the flow rate of the air to be discharged from the suction pads 82 of the holder 80 is reduced as compared with the flow rate for each workpiece 1. Accordingly, the generation of abnormal noise (resonance noise) in transferring each protective sheet 6 can be suppressed in the transfer apparatus 151.

The present invention is not limited to the above preferred embodiment, but various modifications may be made within the scope of the present invention. In the above preferred embodiment, the reading unit 41 and the information transmitting section 42 are provided in each of the transfer apparatuses 151, 161, and 171, and the reading unit 41 reads the identification code 28 of the coin stack cassette 20 or the identification code of the cassette 30, and the information transmitting section 42 transmits the above-mentioned information through the network 18 to the customer 11. As a modification, the reading unit 41 and the information transmitting section 42 may be provided in each of the other processing apparatuses 15 (152, 153, or 154), 16 (162, 163, or 164), and 17 (172, 173, or 174), and the reading unit 41 reads the identification code of the cassette 30, so that the information transmitting section 42 transmits the information on the progress of each process step to the customer 11.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus comprising:
    a control unit including a microprocessor and a memory;
    a cassette mounting section mounting a cassette storing a plurality of plate-shaped workpieces, wherein the cassette comprises a coin stack cassette including a cylindrical wall and further wherein the plurality of plate-shaped workpieces are stacked within the cylindrical wall;
    a transfer apparatus including a movable arm configured and arranged for transferring the plate-shaped workpieces out of the cassette;
    a reading section reading an identification code provided on the cassette mounted on the cassette mounting section, wherein the identification code includes information about a customer that has ordered the processing of the workpieces stored in the cassette, wherein the reading section includes a reading unit attached to the transfer apparatus; and
    an information transmitting section transmitting information, based on the information of the identification code read by the reading section, on the progress of process steps in processing each workpiece stored in the cassette, to the customer that has ordered the processing of each workpiece stored in the cassette, wherein the information transmitting section is associated with the control unit, and further wherein the information transmitted to the customer via the information transmitting section is transmitted via a network.

2. The processing apparatus according to claim 1,
    wherein the coin stack cassette is defined as a first cassette, and
    wherein the movable arm of the transfer apparatus is configured and arranged for transferring each workpiece from the coin stack cassette to a second cassette having a plurality of pairs of shelves for individually supporting the plurality of plate-shaped workpieces in such a manner that each workpiece is supported by each pair of shelves.

3. The processing apparatus according to claim 2,
    wherein the plurality of plate-shaped workpieces include a plurality of semiconductor wafers stored in the coin stack cassette,
    a plurality of protective sheets are also stored in the coin stack cassette in a condition where the plurality of semiconductor wafers and the plurality of protective sheets are alternately stacked, and
    the processing unit includes a determining unit determining whether an object to be transferred by the processing unit is each workpiece or each protective sheet, each semiconductor wafer only being stored into the second cassette by the processing unit according to the result of determination by the determining unit.

4. The processing apparatus according to claim 3, wherein the determining unit includes a vibration detecting means for determining whether an object to be transferred by the processing unit is each workpiece or each protective sheet.

5. The processing apparatus according to claim 4, wherein the vibration detecting means comprises a microphone.

6. The processing apparatus according to claim 3, wherein the transfer apparatus further comprises a holder mounted on the movable arm, wherein the holder is configured to move each workpiece from the first cassette to the second cassette and to move each protective sheet from the first cassette to a storing box, wherein the storing box is different from the second cassette.

7. The processing apparatus according to claim 1, wherein the process steps includes an indication that the cassette has been carried into a particular one of a plurality of processing plants.

8. The processing apparatus according to claim 7, further comprising a plurality of said transfer apparatuses, wherein one of said transfer apparatuses is provided in each of said plurality of processing plants.

9. The processing apparatus according to claim 8, wherein the plurality of processing plants comprises a device circuit manufacturing plant, a wafer grinding plant, and a wafer dividing plant.

10. The processing apparatus according to claim 7, wherein the plurality of processing plants comprises a device circuit manufacturing plant, a wafer grinding plant, and a wafer dividing plant.

11. The processing apparatus according to claim 1, wherein the network comprises the internet.

12. A processing apparatus comprising:
    a control unit including a microprocessor and a memory;
    a cassette mounting section mounting a cassette storing a plurality of plate-shaped workpieces, wherein the cassette includes a plurality of pairs of shelves for individually supporting the plurality of plate-shaped workpieces in such a manner that each workpiece is supported by each pair of shelves;
    a transfer apparatus including a movable arm configured and arranged for transferring the plate-shaped workpieces out of the cassette;
    a reading section reading an identification code provided on the cassette mounted on the cassette mounting section, wherein the identification code includes information about a customer that has ordered the processing of the workpieces stored in the cassette, wherein the reading section includes a reading unit attached to the transfer apparatus; and
    an information transmitting section transmitting information, based on the information of the identification code read by the reading section, on the progress of process steps in processing each workpiece stored in the cassette, to the customer that has ordered the processing of each workpiece stored in the cassette, wherein the information transmitting section is associated with the control unit, and further wherein the information transmitted to the customer via the information transmitting section is transmitted via a network.

13. The processing apparatus according to claim 12, wherein the process steps includes an indication that the cassette has been carried into a particular one of a plurality of processing plants.

14. The processing apparatus according to claim 13, further comprising a plurality of said transfer apparatuses, wherein one of said transfer apparatuses is provided in each of said plurality of processing plants.

15. The processing apparatus according to claim 14, wherein the plurality of processing plants comprises a device circuit manufacturing plant, a wafer grinding plant, and a wafer dividing plant.

16. The processing apparatus according to claim 13, wherein the plurality of processing plants comprises a device circuit manufacturing plant, a wafer grinding plant, and a wafer dividing plant.

17. The processing apparatus according to claim 12, wherein the network comprises the internet.

* * * * *